(12) United States Patent
Easwaran et al.

(10) Patent No.: US 8,106,706 B2
(45) Date of Patent: Jan. 31, 2012

(54) DC BIASING CIRCUIT FOR A METAL OXIDE SEMICONDUCTOR TRANSISTOR

(75) Inventors: Prakash Easwaran, Bangalore (IN); Prasenjit Bhowmik, Bangalore (IN); Sumeet Mathur, Bangalore (IN)

(73) Assignee: Cosmic Circuits Private Limited, Bangalore (IN)

( * ) Notice: Subject to any disclaimer, the term of this patent is extended or adjusted under 35 U.S.C. 154(b) by 118 days.

(21) Appl. No.: 12/463,390

(22) Filed: May 9, 2009

(65) Prior Publication Data

US 2010/0164606 A1    Jul. 1, 2010

(51) Int. Cl.
*G05F 1/10* (2006.01)
*G05F 3/02* (2006.01)

(52) U.S. Cl. ........................ 327/538; 330/296
(58) Field of Classification Search .............. 327/530, 327/538; 330/296
See application file for complete search history.

(56) References Cited

U.S. PATENT DOCUMENTS

| | | | |
|---|---|---|---|
| 6,630,818 B1 * | 10/2003 | Comer et al. | 323/315 |
| 6,693,780 B2 * | 2/2004 | Spehar et al. | 361/56 |
| 7,233,208 B2 * | 6/2007 | Greene | 330/296 |
| 2004/0263256 A1 * | 12/2004 | Ishikawa et al. | 330/296 |

* cited by examiner

*Primary Examiner* — Quan Tra
(74) *Attorney, Agent, or Firm* — Evergreen Valley Law Group, P.C.; Kanika Radhakrishnan

(57) ABSTRACT

A method for biasing a MOS transistor includes AC coupling an input signal from an amplifier stage to a gate of the MOS transistor. The method includes connecting a pair of diodes in an opposing parallel configuration to a bias transistor and a current source. Further, the method includes generating a DC bias voltage through the bias transistor and the current source. The method also includes clamping the voltage at drain of the bias transistor to a fixed voltage by a clamping circuit. Further, the method includes coupling the DC bias voltage to the gate of the MOS transistor through the pair of diodes.

7 Claims, 3 Drawing Sheets

DC BIASING CIRCUIT FOR A METAL OXIDE SEMICONDUCTOR TRANSISTOR

This patent application claims priority from Indian Non provisional patent application number 225/CHE/2009, filed on Feb. 2, 2009 entitled "A DC BIASING CIRCUIT FOR A METAL OXIDE SEMICONDUCTOR TRANSISTOR" and assigned to Cosmic Circuits Private Limited., 303, A Block, AECS Layout, Kundalahalli, Bangalore-560037, India, which is hereby incorporated in its entirety.

BACKGROUND

1. Field

Embodiments of the present disclosure generally relates to biasing circuits and more particularly to a DC biasing circuit for a Metal Oxide Semiconductor (MOS) transistor for achieving low voltage, high swing, and high efficiency performance.

2. Prior Art

Biasing is done to setup initial voltages and currents in transistor circuits to establish an appropriate quiescent point. Various biasing circuits are used to bias a MOS transistor. In a conventional biasing circuit, a resistor (R) is DC coupled to the MOS transistor and an input signal is AC coupled through a capacitor (C). For example, in a current mirror circuit configuration as depicted in the prior art of FIG. 1, a source transistor 110 is mirrored to a mirror transistor 105. The mirroring includes coupling the gate of the source transistor 110 and the gate of the mirror transistor 105. The source transistor 110 is provided with a current source 125. The resistor 115 couples the source transistor 110 to the mirror transistor 105 and the capacitor 120 ac couples the input signal.

The RC combination forms a high pass filter for the signal. In such a combination, value of the resistor has to be large in order to achieve a low high pass corner frequency. With the large resistor value, gate leakage or any leakage can cause significant error in the transistor biasing.

The implementation of the resistor using active elements like MOS transistor and diode results in a large input signal swing which causes the resistance to vary and result in poor signal to noise at amplifier output, and a high distortion. The startup time also can be large due to the use of a large resistor to set a DC bias.

In light of the foregoing discussion, there is a need for efficient DC biasing circuit for a MOS transistor.

Hence, it is an objective of the present disclosure to provide an improved circuit for DC biasing of a Metal Oxide Semiconductor (MOS) transistor with good performance for large input signals and insensitive to leakages at the transistor input.

SUMMARY

Embodiments of the current disclosure described herein provide a DC biasing circuit for a Metal Oxide Semiconductor (MOS) transistor for achieving low voltage, high swing, and high efficiency performance.

An example of a method for biasing a MOS transistor includes AC coupling an input signal from an amplifier stage to a gate of the MOS transistor. The method includes connecting a pair of diodes in an opposing parallel configuration to a bias transistor and a current source. Further, the method includes generating a DC bias voltage through the bias transistor and the current source. The method also includes clamping the voltage at drain of the bias transistor to a fixed voltage by a clamping circuit. Further, the method includes coupling the DC bias voltage at the drain of the bias transistor to the gate of the MOS transistor through the pair of diodes. The clamping voltage is adjusted so that with large input voltage swing, the voltage across the diodes or a high value resistor is limited and does not degrade the performance.

A DC biasing circuit for a Metal Oxide Semiconductor (MOS) transistor is provided. The DC biasing includes a capacitor coupling a gate of a first MOS transistor to a signal source. Further, the DC biasing circuit also includes a high impedance bias source connected to the gate of the first MOS transistor. The DC biasing circuit includes a current source coupled to the gate of the first MOS transistor through a plurality of diodes in an opposing parallel configuration. The DC biasing circuit also includes a second MOS transistor coupled to the plurality of diodes.

Other aspects and example embodiments are provided in the figures and the detailed description that follows.

BRIEF DESCRIPTION OF THE FIGURES

The accompanying figures, similar reference numerals may refer to identical or functionally similar elements. These reference numerals are used in the detailed description to illustrate various embodiments and to explain various aspects and advantages of the present disclosure.

DETAILED DESCRIPTION OF THE EMBODIMENTS

Figure 2:
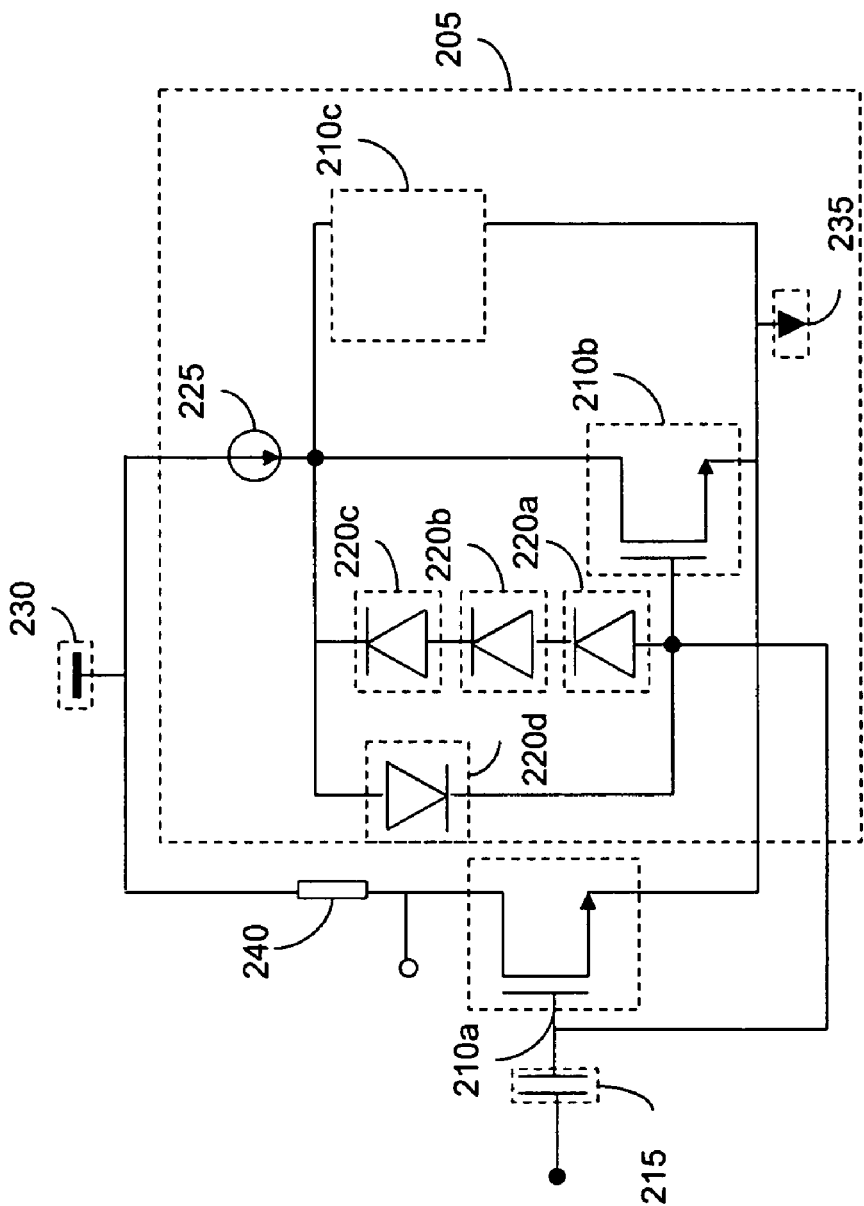
FIG. 2 is a schematic diagram of a DC biasing circuit for Metal Oxide Semiconductor (MOS) transistor, embodying the principles of the invention.

FIG. 2 is a schematic diagram of a DC biasing circuit 205 for Metal Oxide Semiconductor (MOS) transistor 210a, embodying the principles of the invention.

The DC biasing circuit 205 for a MOS transistor 210a, herein known as first transistor 210a, includes a coupling capacitor 215. One end of the coupling capacitor 215 is connected to the gate of the first transistor 210a and the other end is coupled to an input signal.

The first transistor 210a is coupled to the input signal. The input signal can be an output of an operational amplifier although in some embodiments other devices might be used as an input stage.

The DC biasing circuit 205 includes a high impedance bias source. The high impedance bias source includes a bias transistor herein referred as a second transistor 210b and a current source 225. The first transistor 210a and the second transistor 210b are N-type Metal Oxide Semiconductor (NMOS) transistors.

In some embodiments, the transistors can be a P-type Metal Oxide Semiconductor (PMOS) transistor.

Further, the DC biasing circuit 205 includes a clamping circuit 210c. The DC biasing circuit 205 also includes a first diode 220a and a series connection of a stack of diodes 220b, 220c and 220d. The stack of diodes 220b, 220c and 220d are in parallel connection with the first diode 220a. A cathode of the diode 220d is connected to a gate of the first transistor 210a, to an anode of the diode 220a, and to the gate of the second transistor 210b. A cathode of the diode 220c is connected to the clamping circuit 210c and to an anode of the diode 220d. One terminal of the current source 225 is connected to the source of the second transistor 210b and to the clamping circuit 210c. A source of the first transistor 210a and another terminal of the current source 225 are connected to a fixed reference voltage, Vdd 230. Drain of the second transistor 210b is connected to ground 235. The clamping circuit 210c clamps the DC bias voltage at drain of the second transistor 210b to a fixed voltage.

In one embodiment the clamping circuit 210c can be a transistor with the drain and gate shorted together. In some embodiments the clamping circuit 210c can comprise a combination of active or passive circuit elements.

The resistor value of the DC biasing circuit 205 typically exceeds the order of 1 G ohms. Such a circuit design is capable of working down to the lowest voltage possible as the gate bias for the transistor is decoupled from the input signal common mode (DC values of the input signal).

Figure 1:
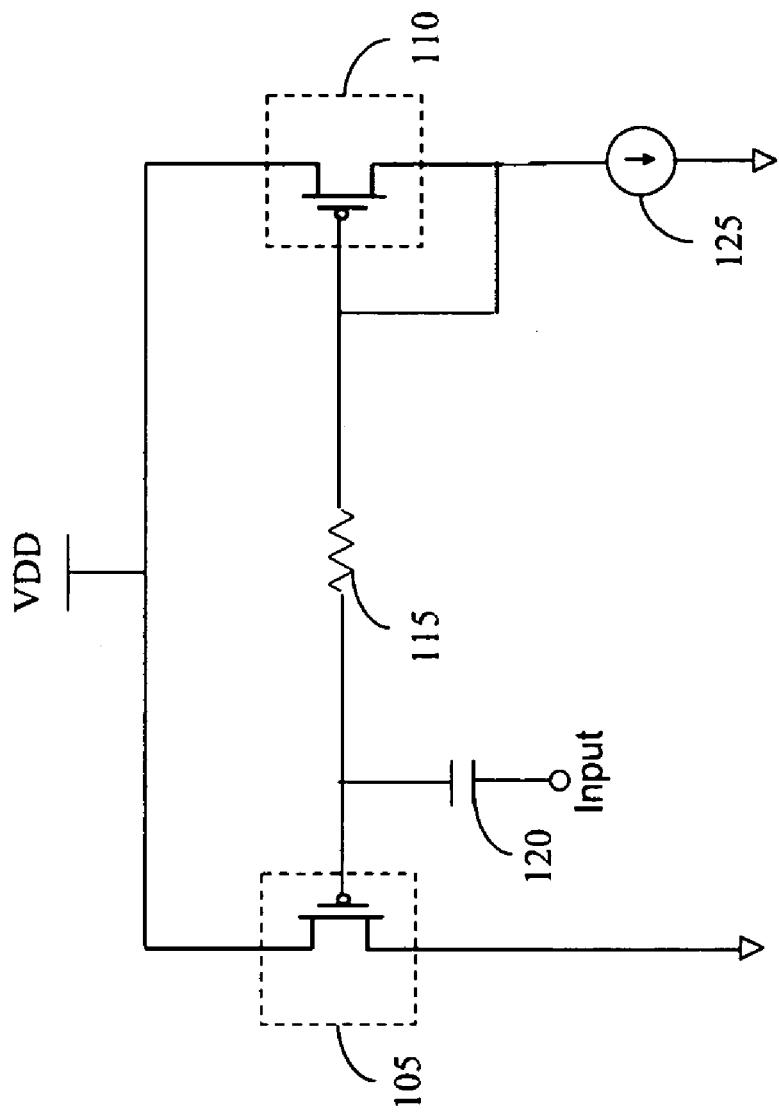
FIG. 1 is a schematic diagram of a biasing technique.

Further, the DC biasing circuit design depicted in FIG. 1 results in a less control on the quiescent current. Also, the value of DC coupling resistor 115 varies with input swing. To overcome this problem, the resistor 115 is replaced by a combination of diodes which include the first diode 220a, the second diode 220b, the third diode 220c and the fourth diode 220d.

The current source 225 is used for bias generation. A current filter is used for generating a gate bias for the first transistor 210a. The current filter includes the second transistor 210b, the diode 220a, the diode 220b, the diode 220c and the diode 220d. The current filter results in a better matching. Any gate leakage does not result in a large mismatch as the leakage current flows through the diodes and only results in a change in drain to source voltage Vds of the second transistor 210b.

The diode 220a, the diode 220b and the diode 220c are connected in series for an efficient and distortion free operation of the first transistor 210a. The usage of lesser number of diodes in conjunction with the clamping circuit restricts the voltage swing across the diodes. The gate of the first transistor 210b is connected in series with the diode 220a, the diode 220b, and diode 220c to prevent the discharging of the voltage through the drain of the second transistor 210b. Further, the output is taken across the load 240.

The DC biasing circuit 205 facilitates in achieving a very low distortion performance at high swings, while driving a very small resistive load. Also a good transient response can be achieved in the first transistor 210a in the presence of power supply or spurious spike by employing the DC biasing circuit 205 to the first transistor 210a.

In an embodiment the DC biasing circuit 205 can be used to bias the output stage of an amplifier.

Figure 3:
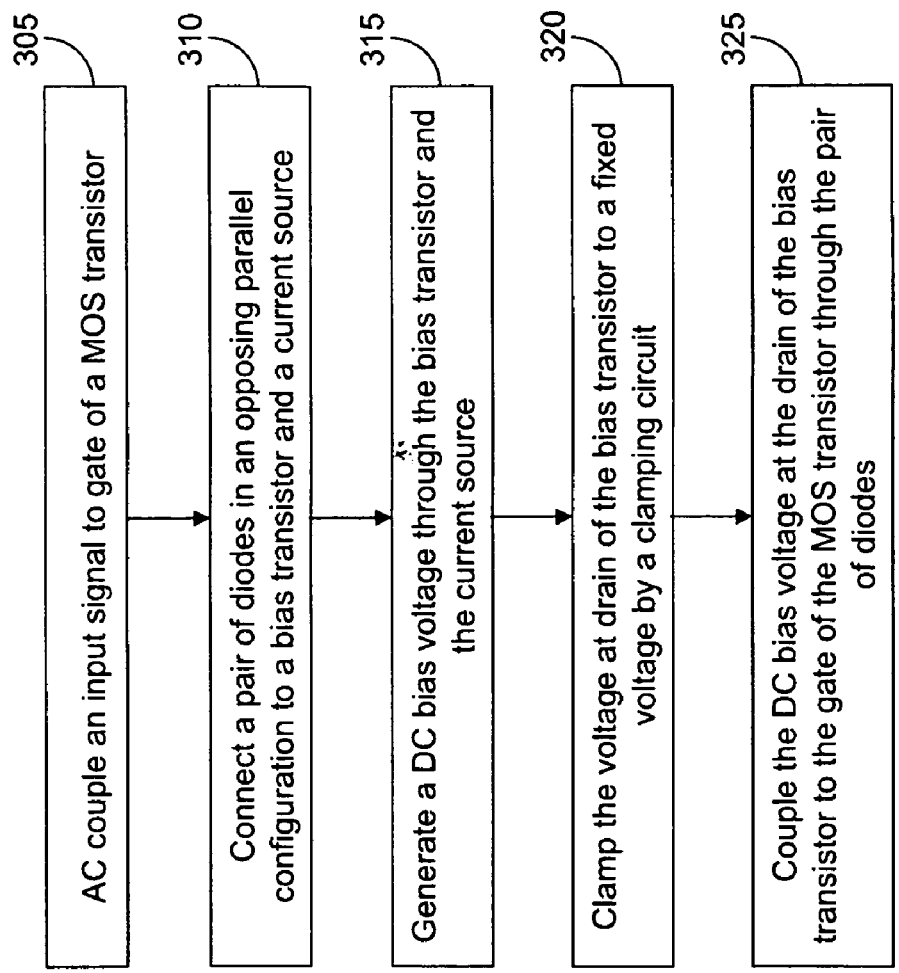
FIG. 3 is an illustration of a method of biasing a metal oxide semiconductor (MOS) transistor.

FIG. 3 is an illustration of a method of biasing a metal oxide semiconductor (MOS) transistor.

At step 305, an input signal is AC coupled to gate of a MOS transistor. The input signal is AC coupled through a capacitor.

At step 310, a pair of diodes is connected in an opposing parallel configuration to a bias transistor and a current source. The pair of diodes can be connected by connecting a plurality of diodes in series and connecting another diode in opposing parallel configuration with the series plurality of diodes.

At step 315, a DC bias voltage is generated through the bias transistor and the current source.

At step 320, the DC bias voltage is clamped at drain of the bias transistor to a fixed voltage by a clamping circuit. The usage of lesser number of diodes in conjunction with the clamping circuit restricts the voltage swing across the diodes.

At step 325, the DC bias voltage at drain of the bias transistor is coupled to the gate of the MOS transistor through the pair of diodes.

In the foregoing discussion, the term "coupled" refers to either a direct electrical connection between the devices connected or an indirect connection through one or more passive or active intermediary devices. The term "circuit" means at least either a single component or a multiplicity of components, either active or passive, that are connected together to provide a desired function. The term "signal" means at least one current, voltage, charge, data, or other signal.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A method of biasing a metal oxide semiconductor (MOS) transistor, the method comprising:
   AC coupling an input signal to a gate of the MOS transistor; and
   generating a DC bias voltage at the gate of the MOS transistor from a DC current source through a parallel combination of a minor transistor, a forward-biased diode, and a reverse-biased diode stack, a DC voltage clamp being connected between the DC current source and a source of the MOS transistor, the combination of the forward-biased diode and the reverse-biased diode stack having a DC resistance value exceeding one gigaohm.

2. The method of claim 1, wherein the reverse-biased diode stack comprises three diodes.

3. A DC biasing circuit for a Metal Oxide Semiconductor (MOS) transistor, the circuit comprising:
   a first MOS transistor having a source connected to a first power supply terminal, a drain connected to an output node, and a gate;
   a load connected between the output node and a second power supply terminal;
   a current source connected between the second power supply terminal and a bias node;
   a first diode in a forward-biased connection between the bias node and the gate;
   a diode stack of a plurality of diodes in series in a reverse-biased connection between the bias node and the gate;
   a voltage clamp connected between the bias node and the source of the first MOS transistor; and
   a second MOS transistor having a source connected to the first transistor source, a gate connected to the first transistor gate, and a drain connected to the bias node, the combination of the first diode and the diode stack having a DC resistance value exceeding one gigaohm.

4. The DC biasing circuit of claim 3, wherein the voltage clamp comprises a transistor with a drain and a gate shorted together.

5. The DC biasing circuit of claim 3, wherein the diode stack comprises three diodes.

6. The DC biasing circuit of claim 3, wherein the load comprises a resistor.

7. The DC biasing circuit of claim 3 further comprising a capacitor connected to the gate of the first transistor.

* * * * *